(12) United States Patent
Lee et al.

(10) Patent No.: US 7,486,029 B2
(45) Date of Patent: Feb. 3, 2009

(54) CIRCUIT FOR DETECTING END OF LIFE OF FLUORESCENT LAMP

(75) Inventors: Young-Sik Lee, Seoul (KR); Gye-Hyun Cho, Bucheon (KR)

(73) Assignee: Fairchild Korea Semiconductor, Ltd., Bucheon-Si (KR)

( * ) Notice: Subject to any disclaimer, the term of this patent is extended or adjusted under 35 U.S.C. 154(b) by 56 days.

(21) Appl. No.: 11/807,632

(22) Filed: May 30, 2007

(65) Prior Publication Data

US 2007/0296416 A1    Dec. 27, 2007

(30) Foreign Application Priority Data

May 30, 2006    (KR) .................. 10-2006-0048769

(51) Int. Cl.
*H05B 37/02*    (2006.01)

(52) U.S. Cl. .................. 315/224; 315/291; 315/194; 315/308; 315/307; 315/209 R

(58) Field of Classification Search ............. 315/209 R, 315/244, 224, 291, 307, 308, 194, 360; 324/414, 324/416

See application file for complete search history.

(56) References Cited

U.S. PATENT DOCUMENTS

| | | | |
|---|---|---|---|
| 5,739,645 A | 4/1998 | Xia et al. | |
| 5,808,422 A | 9/1998 | Venkitasubrahmanian et al. | |
| 5,883,473 A | 3/1999 | Li et al. | |
| 6,008,592 A * | 12/1999 | Ribarich | 315/225 |
| 6,538,448 B1 * | 3/2003 | Tabell | 324/414 |
| 6,661,182 B2 * | 12/2003 | Sridharan | 315/224 |
| 6,720,739 B2 | 4/2004 | Konopka | |
| 7,064,499 B2 * | 6/2006 | Lott | 315/291 |
| 7,378,807 B2 * | 5/2008 | Feldtkeller et al. | 315/308 |

* cited by examiner

*Primary Examiner*—Haissa Philogene
(74) *Attorney, Agent, or Firm*—Sidley Austin LLP

(57) ABSTRACT

A circuit for detecting the end of life of a fluorescent lamp is provided. In this circuit, a rectifier rectifies a voltage signal detected from a ballast. A phase detector detects the phase of the voltage signal and outputs at least one phase detection signal. A signal separator separates the rectified voltage on a phase basis to generate first and second voltage signals in response to the phase detection signal. A first maximum level detector detects the maximum level of the first voltage signal. A second maximum level detector detects the maximum level of the second voltage signal. A first comparison unit compares the first and second maximum levels and detects whether or not the difference is higher than a predetermined allowable level. A controller determines whether or not the fluorescent lamp is at the end of life in response to the detection from the first comparison unit.

19 Claims, 9 Drawing Sheets

CIRCUIT FOR DETECTING END OF LIFE OF FLUORESCENT LAMP

CROSS-REFERENCE TO RELATED APPLICATION

This application claims priority to and the benefit of Korean Patent Application No. 10-2006-0048769 filed in the Korean Intellectual Property Office on May 30, 2006, the entire content of which is incorporated herein by reference.

BACKGROUND

1. Field of the Invention

The present invention relates to a circuit for detecting the end of life of a fluorescent lamp, and more particularly to a circuit for detecting the end of life of a fluorescent lamp in an early stage of the end of life so as to effectively protect a ballast, a socket, and relevant circuits of the fluorescent lamp.

2. Description of the Related Art

If a fluorescent lamp is used for a long time, Barium (Ba) or Strontium (Sr), the material of an auxiliary emitter for thermionic emission coated on an electrode (cathode) at each end of the fluorescent lamp, is absorbed into inner or outer walls of its tube and the amount of material coated on filaments of the lamp gradually decreases. When the amount of material coated on the filaments decreases below a certain level, the voltage and current of the fluorescent lamp become asymmetrical. If the coated material completely disappears, the lamp no longer turns on.

One can easily identify a lamp whose filament has been cut or fluorescent materials have completely disappeared since such a lamp no longer turns on. However, it is difficult to visually determine whether the lamp life is at the end before its fluorescent materials completely disappear. Thus, general users continue using a lamp even when the lamp is at the end of its life.

When a lamp is at the end of its life, heat is generated at an electrode with a reduced thermionic emission material due to an increased filament heat resistance and a constant electrode current. As the lamp approaches the end of its life, the temperature of the electrode gradually increases. If the electrode generates intense heat, the heat may melt a lamp socket connected to the electrode, thereby causing a dangerous situation. This is described below in more detail with reference to the drawings.

FIG. 1 illustrates the configuration of a so-called electronic ballast. A controller IC 10 can drive two transistor switches M1 and M2 alternately to generate a square wave at an output terminal $V_A$. The square wave then passes through a filter including elements L, Cs, and Cp producing a sinusoidal wave to a fluorescent lamp. A discharge lamp, such as a fluorescent lamp, can have a negative resistance characteristic. This means that after turning on the lamp, the current continues to increase. To compensate this characteristic, discharge lamps require a circuit that prevents the continued increase of their lamp current and stabilizes the lamp current at a substantially constant level. This circuit is referred to as a ballast.

In order to provide and maintain an appropriate lamp current, some designs use an inductor with a very high inductance since the conventional ballast directly uses 60 Hz power. Therefore, the ballast needs a large size coil to provide adequate impedance. An electronic ballast has been developed to overcome this problem.

There are various types of electronic ballasts. One of the often-used ballasts is a half-bridge resonant inverter as shown in FIG. 1. The electronic ballast can reduce the size of the inductor by switching on and off a voltage $V_{DC}$ using the switches M1 and M2 to generate a high frequency AC voltage.

Before a lamp is turned on, the resistance between the electrodes of the lamp is very high. Once the lamp is turned on, the resistance between the electrodes of the lamp is reduced to hundreds of ohms. The characteristics of the resonant circuit including L, Cs, Cp, and the resistor between the electrodes vary as shown in FIG. 2 before and after the lamp is turned on. "fr" is the resonant frequency corresponding to the circuit elements L, Cs, and Cp in FIG. 1, and "fo" refers to the operating frequency of the switches M1 and M2 in FIG. 1. The curve labeled "Before ignition" refers to the resonant characteristic of the L, Cs, and Cp circuit elements before the lamp is turned on, whereas the "After ignition" refers to the same characteristic after the ignition. The frequencies "$f_{ignition}$" and "$f_{preheat}$" refer to the operating frequency during ignition and preheat, respectively. Both these steps occur before the lamp is turned on and thus correspond to the "Before ignition" curve. "$f_{run}$" is the operating frequency after the lamp is turned on, and thus corresponds to the "After ignition" curve.

However, if a fluorescent lamp is used for a long time, the electron emitting material that is coated on the cathodes of the fluorescent lamp is gradually absorbed onto its tube, thereby reducing the amount of thermions emitted from the electrode into the tube. Here the term "thermions" refers to the electrons emitted from metals at high temperatures. This phenomenon is caused by adhesion of material such as Ba or Sr, coated on the electrodes of the lamp, to fluorescent materials on an inner surface of the tube. Accordingly, the electrodes of the fluorescent lamp that was used for a long time can blacken: this process is sometimes called blackening or darkening.

The blackening reduces the amount of current provided from the electrodes into the tube due to the reduced amount of thermions emitted from the electrodes. In addition, the amount of electron emitting materials on the electrodes of the fluorescent lamp may be reduced to different levels. As the lamp current, which flows from the electrodes of the fluorescent lamp into its tube, decreases the lamp voltage increases to a different level. Also, as the lamp current decreases, the brightness of the lamp also decreases. These signs are sometimes referred to as a fluorescent lamp end-of-life phenomena. Generally, in the early stage of the end of life of the fluorescent lamp, it is impossible to visually determine whether its brightness has been reduced.

If the life of a specific electrode (filament) of a fluorescent lamp is ended, then the amount of current flowing from the electrode to an opposite electrode is reduced. The lamp voltage varies inversely to the lamp current, as shown in FIG. 4.

If the end-of-life phenomenon continues, the extent of the asymmetry of the current and voltage of the fluorescent lamp increases. If the lamp current is reduced below the minimum current required to keep the lamp on, the lamp will not remain in an on state, but instead it will alternately turn on and off. Finally, if the electron emitting material is completely discharged from the electrodes of the fluorescent lamp, the lamp stays in the off state permanently.

In addition, if the amount of an electron emitting material on an electrode of the fluorescent lamp is reduced, the heat resistance of the electrode is increased. If an upper electrode in FIG. 1 is darkened, a current in direction Ia is decreased while current of direction Ib is increased. High heat is generated in the electrode of the fluorescent lamp due to the increased heat resistance of the electrode and the increased current of direction Ib. This heat can melt a plastic socket connected to the electrode of the lamp.

FIG. 3 illustrates a conventional method to determine whether or not a lamp is near the end of its life. In this conventional method, a voltage, obtained through division of a voltage between the electrodes of a lamp, is detected and, if the detected voltage is higher than a predetermined reference level, it is determined that the lamp is at the end of its life and the ballast is deactivated.

Although this method is advantageous in that it can easily detect the end of life of the lamp, it has a problem in that a protection circuit may operate abnormally depending on how passive elements are selected. In addition, if the lower electrode rather than the upper electrode is darkened in FIG. 3, a voltage increase caused by darkening cannot be detected with the voltage detected through the voltage division alone, thereby failing to correctly detect the end of life of the lamp.

SUMMARY

Briefly and generally, some embodiments of the present invention include a circuit for detecting the end of life of a fluorescent lamp, which effectively detects not only that both electrodes of the fluorescent lamp have been darkened but also that one of the two electrodes has been darkened to detect the end of life of the fluorescent lamp in an early stage of the end of life, thereby effectively protecting a ballast, a socket, and relevant circuits of the fluorescent lamp.

Some embodiments include a circuit for detecting the end of life of a fluorescent lamp, the circuit comprising a rectifier for rectifying a voltage signal detected from a ballast and outputting a rectified voltage; a phase detector for detecting a phase of the voltage signal and outputting at least one phase detection signal; a signal separator for separating the rectified voltage from the rectifier on a phase basis to generate a first voltage signal and a second voltage signal in response to the at least one phase detection signal; a first maximum level detector for detecting a maximum level of the first voltage signal; a second maximum level detector for detecting a maximum level of the second voltage signal; a first comparison unit for comparing the first maximum level detected by the first maximum level detector and the second maximum level detected by the second maximum level detector and performing detection as to whether or not a difference between the first and second maximum levels is higher than a predetermined allowable level; and a controller for determining whether or not the fluorescent lamp is at the end of life in response to the detection from the first comparison unit.

In some embodiments the circuit for detecting the end of life of a fluorescent lamp further comprises a buffer for buffering the voltage signal detected from the ballast, the buffer being provided between the ballast and the rectifier, and the buffer preferably performs inversion buffering of the voltage signal.

In some embodiments the buffer includes a comparator for receiving the voltage signal through an inverting terminal and a ground voltage through a non-inverting terminal and performing a comparison operation; and a resistor provided between the inverting terminal and an output terminal of the comparator.

In some embodiments the rectifier includes a first comparator for receiving the voltage signal buffered by the buffer and the ground voltage and performing a comparison operation; a first diode provided between an output terminal of the first comparator and a first node; a second diode provided between the output terminal of the first comparator and a second node; and a second comparator for receiving a signal from the first node and a signal from the second node and performing a comparison operation to output the rectified voltage.

In some embodiments the first comparator receives the voltage signal through an inverting terminal and receives the ground voltage through a non-inverting terminal and the second comparator receives the signal from the first node through an inverting terminal and receives the signal from the second node through a non-inverting terminal.

In some embodiments the rectifier further includes a first resistor provided between the inverting terminal of the first comparator and the first node; and a second resistor provided between an output terminal and the inverting terminal of the second comparator.

In some embodiments a reverse voltage from the output terminal of the first comparator is applied to the first diode and a forward voltage from the output terminal of the first comparator is applied to the second diode.

In some embodiments the at least one phase detection signal includes a first phase detection signal associated with detection of a positive phase of the voltage signal and a second phase detection signal associated with detection of a negative phase of the voltage signal.

In some embodiments the phase detector includes a comparator for receiving the voltage signal buffered by the buffer and a ground voltage and performing a comparison operation to output the first phase detection signal; and an inverter for inverting an output of the comparator to output the second phase detection signal.

In some embodiments the comparator receives the buffered voltage signal through an inverting terminal and receives the ground voltage through a non-inverting terminal.

In some embodiments the first comparison unit includes a first comparator for receiving the first maximum level through a non-inverting terminal and the second maximum level through an inverting terminal and performing a comparison operation; a second comparator for receiving the first maximum level through an inverting terminal and the second maximum level through a non-inverting terminal and performing a comparison operation; and a logic unit for performing a logical operation between an output signal of the first comparator and an output signal of the second comparator.

In some embodiments the logical unit performs a logical sum operation.

In some embodiments the circuit for detecting the end of life of a fluorescent lamp further comprises a second comparison unit for comparing the first and second maximum levels with a predetermined reference voltage and performing detection as to whether or not at least one of the first and second maximum levels is higher than the predetermined reference voltage, wherein the controller determines whether or not the fluorescent lamp is at the end of life in response to the detection from the second comparison unit.

In some embodiments the second comparison unit includes a first comparator for receiving the first maximum level through an inverting terminal and the reference voltage through a non-inverting terminal and performing a comparison operation; a second comparator for receiving the second maximum level through an inverting terminal and the reference voltage through a non-inverting terminal and performing a comparison operation; and a logic unit for performing a logical operation between an output signal from the first comparator and an output signal from the second comparator. In some embodiments the logical unit performs a logical product operation.

BRIEF DESCRIPTION OF THE DRAWINGS

The above and other objects, features and other advantages of the present invention will be more clearly understood from the following detailed description taken in conjunction with the accompanying drawings.

FIG. 2 illustrates changes in resonant characteristics of an electronic ballast before and after a fluorescent lamp is turned on.

DETAILED DESCRIPTION

Embodiments of the present invention will now be described in detail with reference to the accompanying drawings. The embodiments of the present invention have been disclosed for illustrative purposes only and should not be construed as limiting the scope of the present invention.

Figure 1:
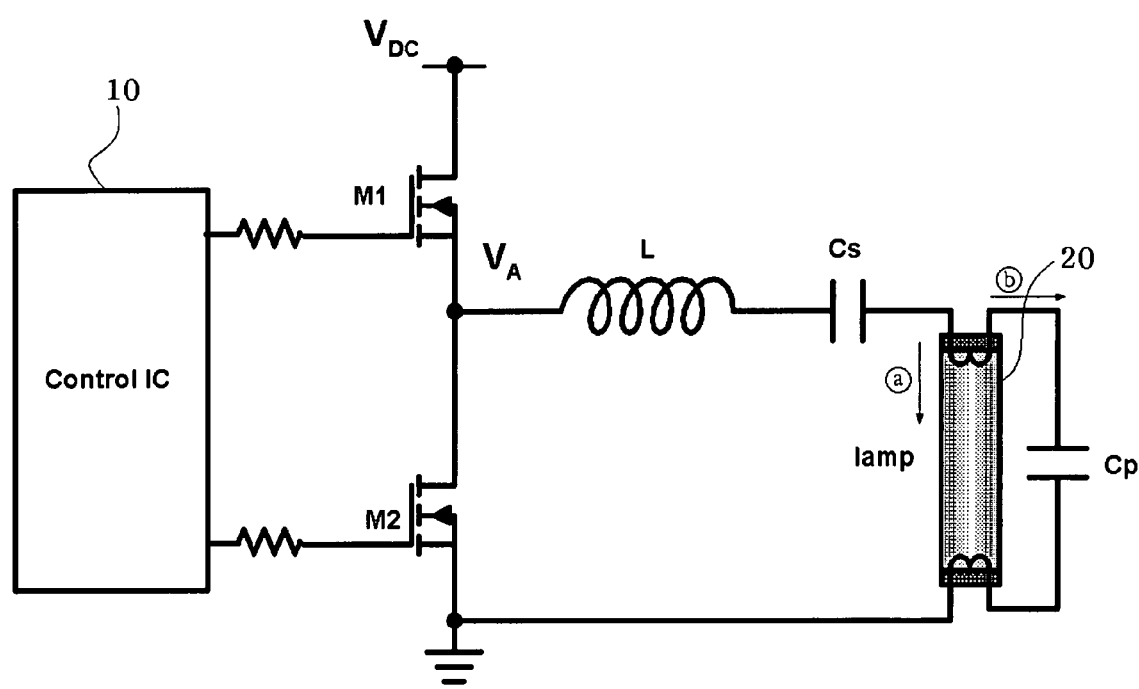
FIG. 1 illustrates the configuration of an electronic ballast.
Figure 2:
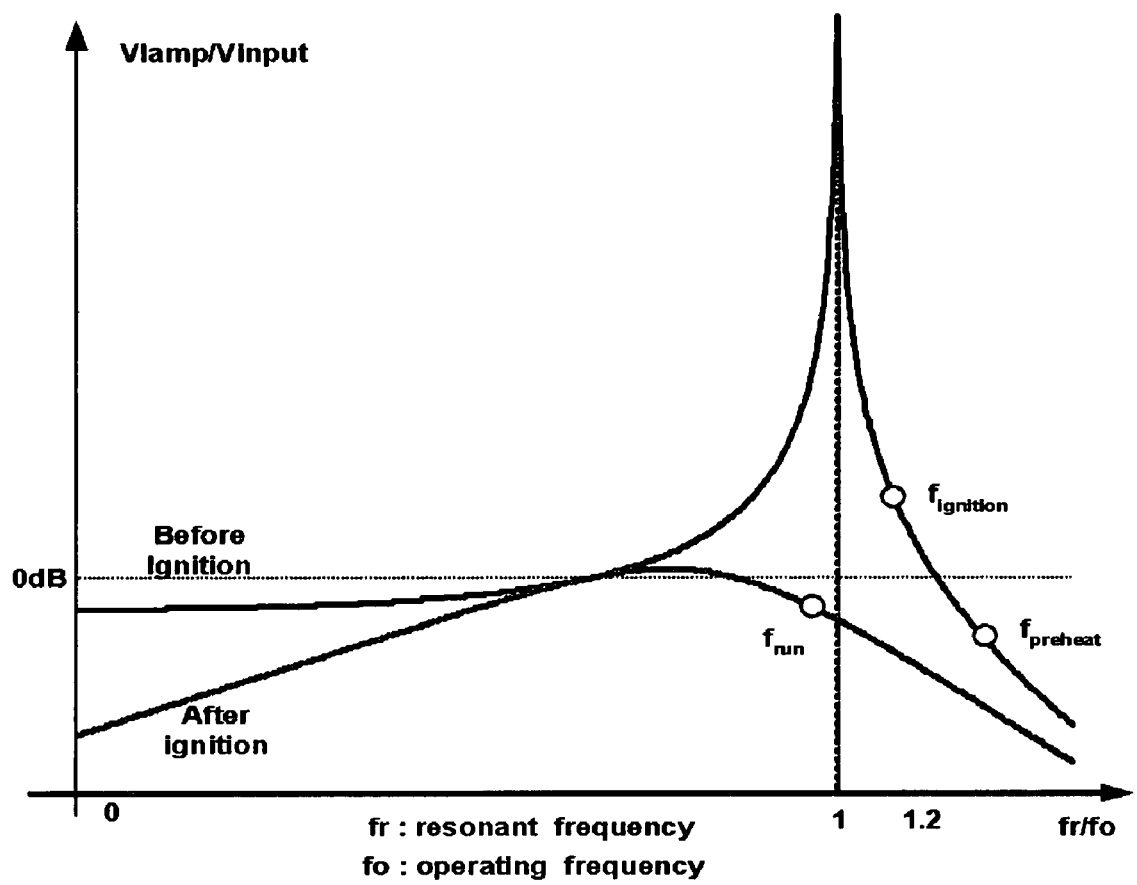
Figure 3:
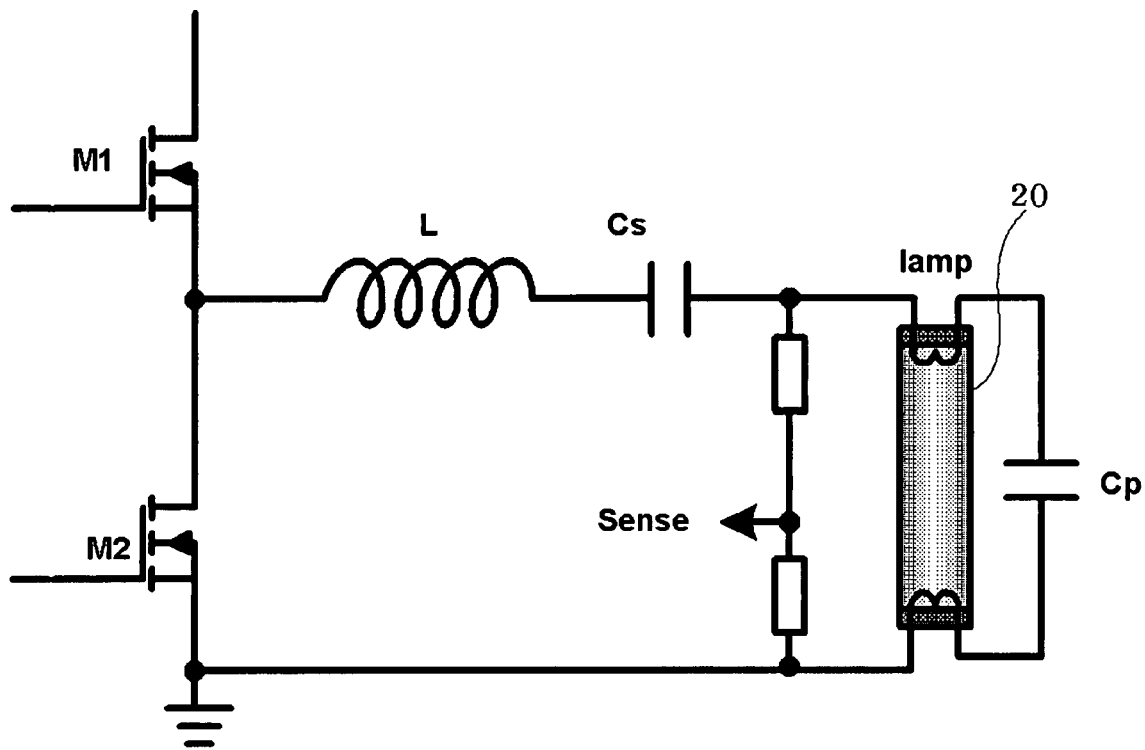
FIG. 3 is a schematic diagram illustrating a conventional method for detecting the end of life of a fluorescent lamp.
Figure 4:
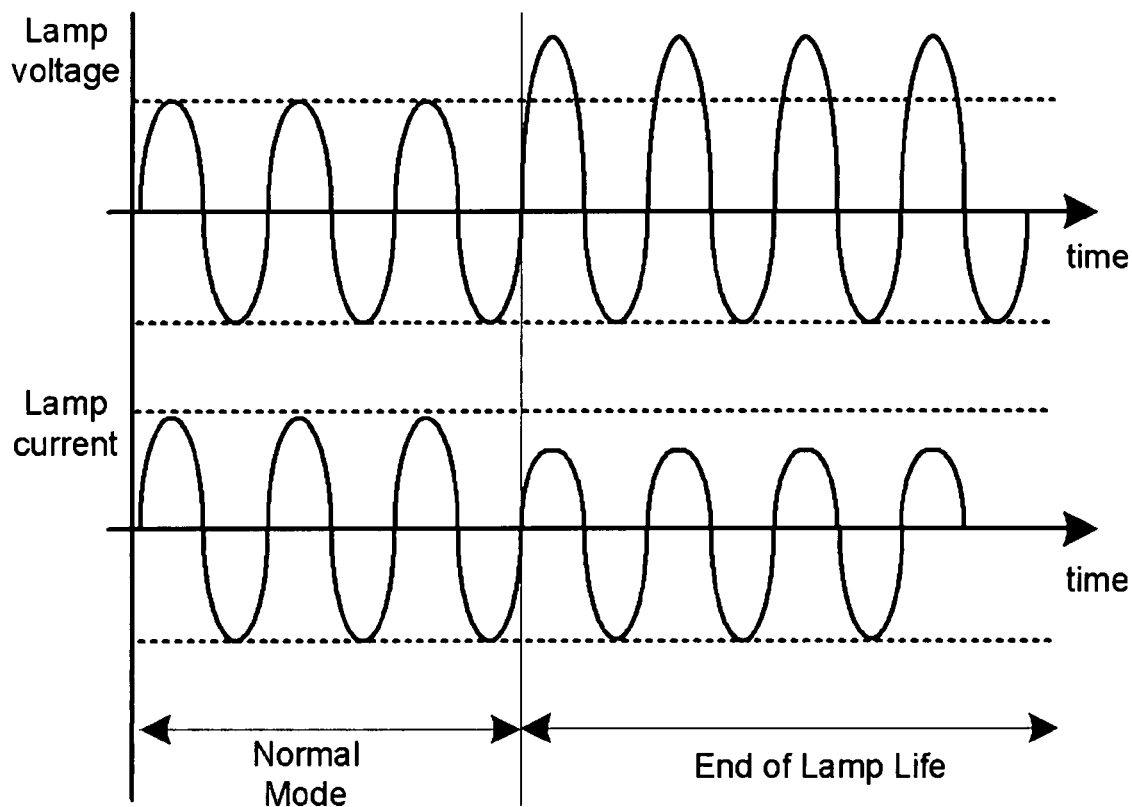
FIG. 4 illustrates changes in voltage and current of a fluorescent lamp when it is at the end of life.
Figure 5:
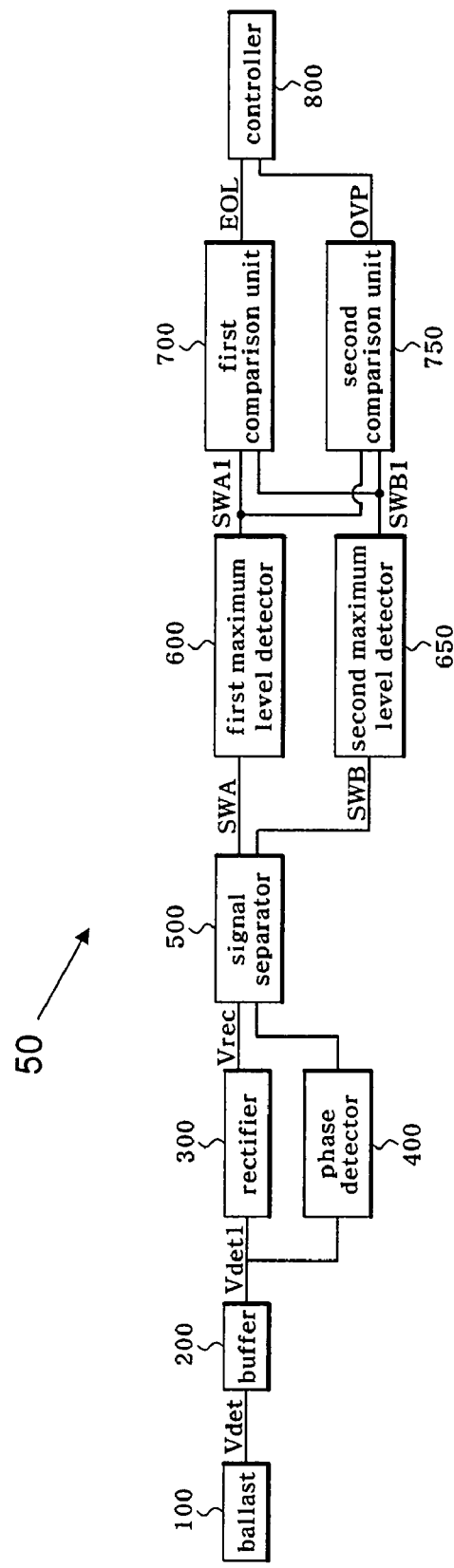
FIG. 5 illustrates the configuration of a circuit for detecting the end of life of a fluorescent lamp according to an embodiment of the present invention.

FIG. 5 illustrates an embodiment of a circuit 50 for detecting the end of life of a fluorescent lamp.

The circuit 50 can include a ballast 100, a buffer 200, a rectifier 300, a phase detector 400, a signal separator 500, a first maximum level detector 600, a second maximum level detector 650, a first comparison unit 700, a second comparison unit 750, and a controller 800. The buffer 200 can buffer a voltage signal Vdet detected from the ballast 100. The rectifier 300 can rectify a voltage signal.Vdet1, received from the buffer 200, and output a rectified voltage Vrec. The phase detector 400 can detect the phase of the voltage signal Vdet1 and output at least one phase detection signal. Signal separator 500 can receive the rectified voltage Vrec and the at least one phase detection signal. The signal separator 500 can separate the rectified voltage Vrec using the phase information of the at least one phase detection signal, and generate a first voltage signal SWA and a second voltage signal SWB. The first maximum level detector 600 can detect a maximum level SWA1 of the first voltage signal SWA. The second maximum level detector 650 can detect a maximum level SWB1 of the second voltage signal SWB. The first comparison unit 700 can compare the first and second maximum levels SWA1 and SWB1 and detect whether the difference between the first and second maximum levels is higher than a predetermined allowable level. The second comparison unit 750 can compare the first and second maximum levels SWA1 and SWB1 with a predetermined reference voltage and detect whether at least one of the first maximum level SWA1 and the second maximum level SWB1 is higher than the predetermined reference voltage. The controller 800 can determine whether the fluorescent lamp is at the end of its life in response to the detection result from the first comparison unit 700 and the detection result from the second comparison unit 750.

The operation of the circuit 50 will now be described in detail with reference to FIGS. 5 to 9B.

Figure 6:
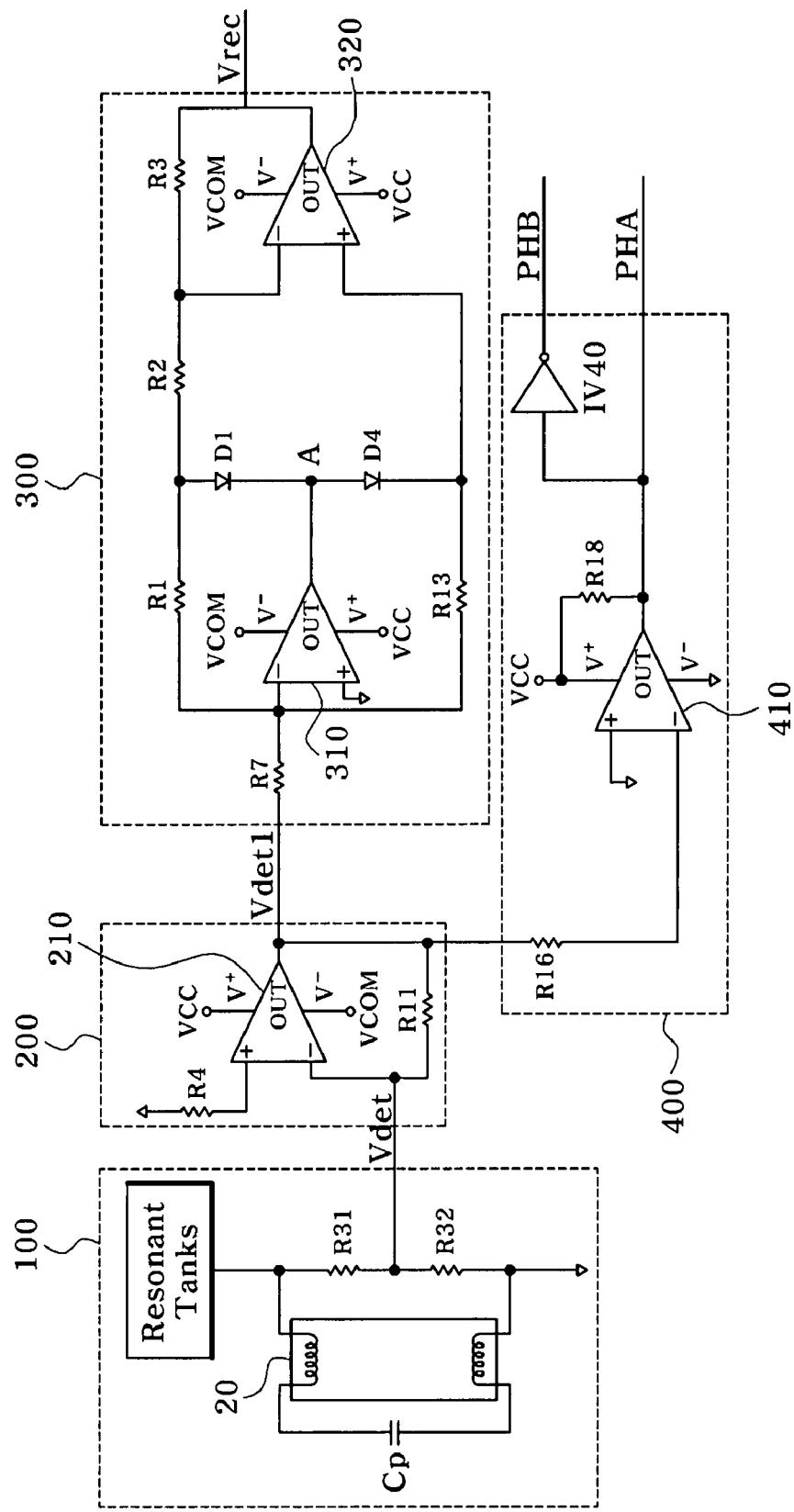
FIG. 6 illustrates the configuration of a buffer, a rectifier, and a phase detector included in the circuit for detecting the end of life of a fluorescent lamp according to the embodiment.

The ballast 100 can generate the voltage signal Vdet as shown in FIG. 6. The voltage signal Vdet can be generated by dividing a voltage between electrodes of a fluorescent lamp 20 through resistors R31 and R32 and outputted at a node between resistors R31 and R32.

The buffer 200 can buffer the voltage signal Vdet and output a voltage signal Vdet1. Specifically, as shown in FIG. 6, the voltage signal Vdet can be input to an inverting terminal of a comparator 210 included in the buffer 200. The comparator 210 can compare the input voltage signal Vdet with a ground voltage and generate a voltage signal Vdet1. If the voltage signal Vdet is positive (+), the comparator 210 can invert it and output a negative voltage. If the voltage signal Vdet is negative (−), the comparator 210 can invert it and output a positive voltage. Thus, the buffer 200 performs inversion buffering of the voltage signal Vdet.

The rectifier 300 then can receive and rectify the voltage signal Vdet1 and output a rectified voltage Vrec. More specifically, as shown in FIG. 6, the voltage signal Vdet1 can be input to the comparator 310 through a resistor R7. The comparator 310 then can compare the voltage signal Vdet1 with the ground voltage and output a positive or negative voltage signal to a node A. If the voltage signal Vdet is positive and thus the voltage signal Vdet1 produced by performing inversion buffering of the voltage signal Vdet is negative, the comparator 310 can output a positive voltage signal to the node A. The voltage signal of the node A can be provided to a non-inverting terminal of a comparator 320 through a diode D4. The comparator 320 can compare the input voltage signal with a voltage signal of its inverting terminal and output the rectified voltage Vrec in the same phase as the voltage signal of the node A.

On the other hand, if the voltage signal Vdet is negative and thus the voltage signal Vdet1 produced by performing inversion buffering of the voltage signal Vdet is positive, the comparator 310 can output a negative voltage signal to the node A. The voltage signal of the node A can be provided to the inverting terminal of the comparator 320 through a diode D1. The comparator 320 can compare the input voltage signal with a voltage signal of its non-inverting terminal and output the rectified voltage Vrec in opposite phase to the voltage signal of the node A.

Figure 9A:
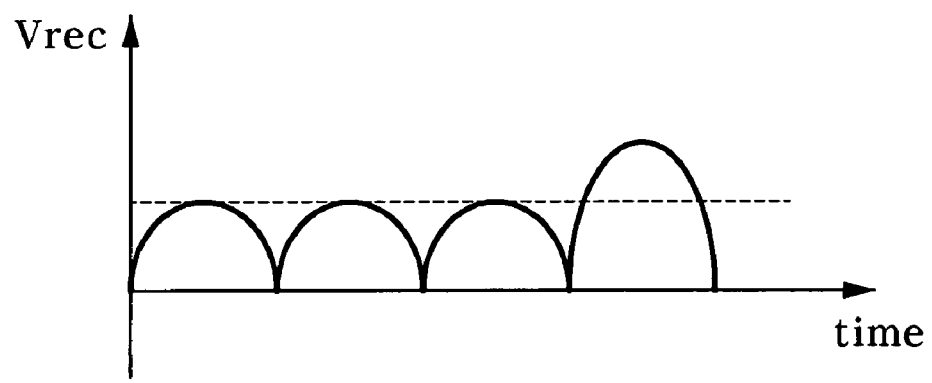
FIG. 9A illustrates a waveform of a voltage rectified by a rectifier included in the circuit for detecting the end of life of a fluorescent lamp according to the embodiment when the fluorescent lamp is at the end of its life.

Accordingly, the rectified voltage Vrec generated through the buffer 200 and the rectifier 300 is a full-wave rectified version of the voltage signal Vdet from the ballast 100 as shown in FIG. 9a.

The phase detector 400 can detect the phase of the voltage signal Vdet1 and output a phase detection signal PHA and a phase detection signal PHB. Specifically, as shown in FIG. 6, if the voltage signal Vdet is positive and thus the voltage signal Vdet1, produced by performing inversion buffering of the voltage signal Vdet, is negative, a comparator 410, included in the phase detector 400, can compare the voltage signal Vdet1 with a ground voltage and output a positive voltage signal, thereby generating a "high" phase detection signal PHA. Accordingly, in intervals in which the voltage signal Vdet is positive, a "high", or "enabled" phase detection signal PHA is generated to detect the positive voltage signal Vdet.

On the other hand, if the voltage signal Vdet is negative and thus the voltage signal Vdet1, produced by performing inversion buffering of the voltage signal Vdet, is positive, the comparator 410 can compare the voltage signal Vdet1 with the ground voltage and output a negative voltage signal, thereby generating a "high" phase detection signal PHB. Accordingly, in intervals in which the voltage signal Vdet is negative, a "high", or "enabled" phase detection signal PHB is generated to detect the negative voltage signal Vdet.

Figure 7:
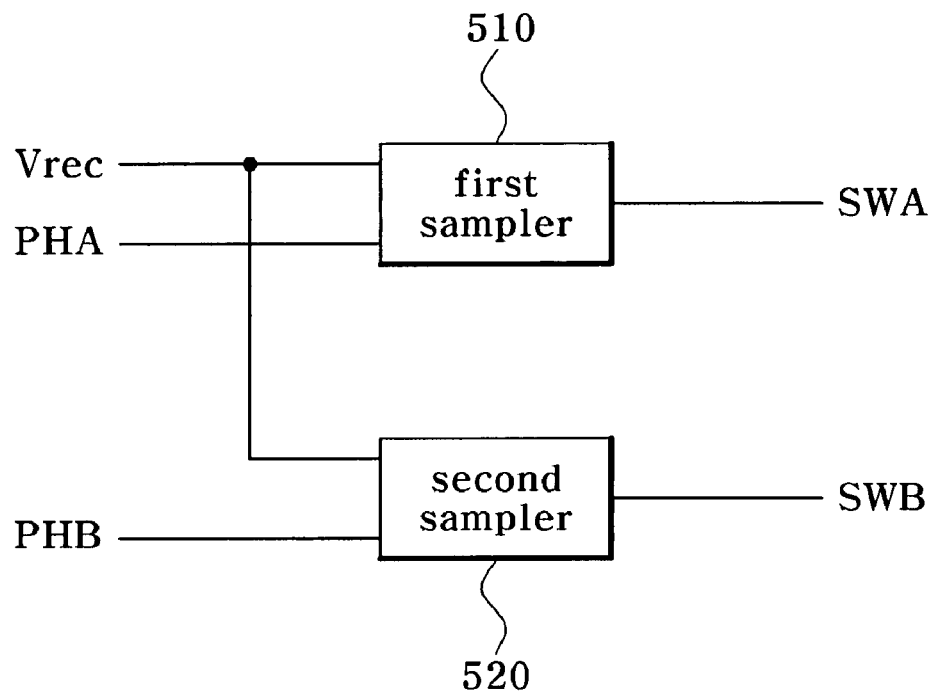
FIG. 7 illustrates the configuration of a signal separator included in the circuit for detecting the end of life of a fluorescent lamp according to the embodiment.
Figure 9B:
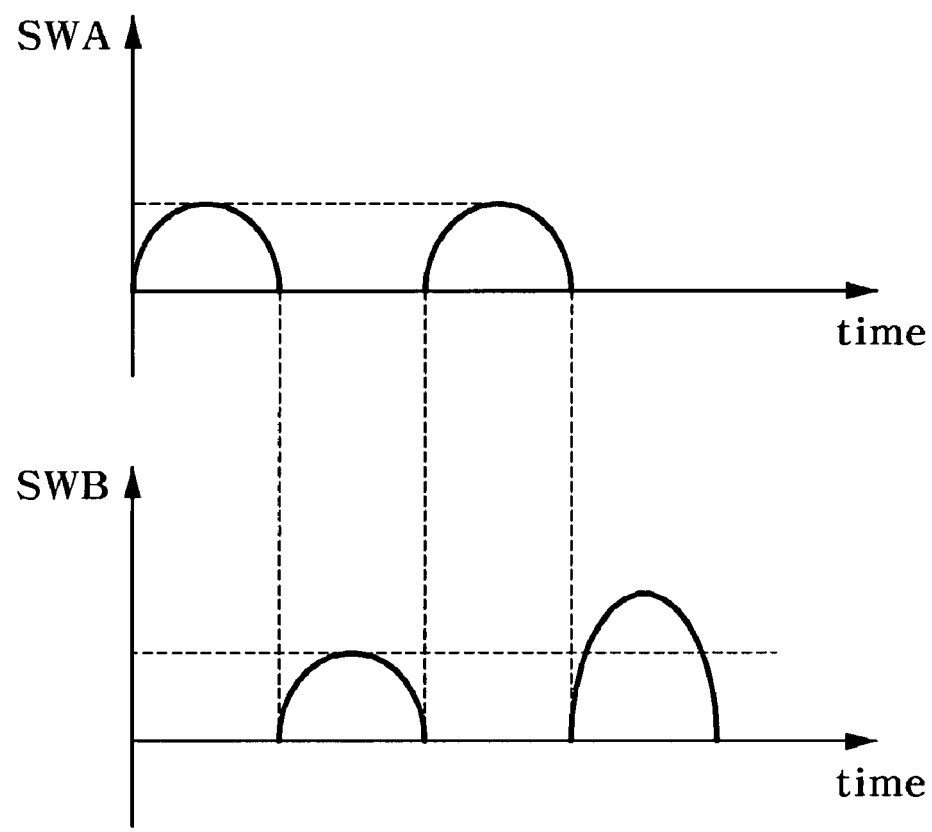
FIG. 9B illustrates a waveform of a first voltage signal and a second voltage signal, which are obtained by separating a positive-phase part and a negative-phase part from a voltage signal detected from a ballast in the embodiment.

In response to the phase detection signal PHA and the phase detection signal PHB, the signal separator 500 can separate the rectified voltage Vrec, received from the rectifier 300, on a phase basis to generate a first voltage signal SWA and a second voltage signal SWB as shown in FIG. 5. More specifically, as shown in FIG. 7, a first sampler 510 in the signal separator 500 can generate the first voltage signal SWA by separating that part of the rectified voltage Vrec, which corresponds to intervals in which the phase detection signal PHA is enabled (i.e., intervals in which the voltage signal Vdet is positive). Accordingly, the first voltage signal SWA can have a form as shown in FIG. 9B. A second sampler 520 can generate the second voltage signal SWB by separating that part of the rectified voltage Vrec, which corresponds to intervals in which the phase detection signal PHB is enabled (i.e., intervals in which the voltage signal Vdet is negative). Accordingly, the second voltage signal SWB can have a form as shown in FIG. 9B.

Other types of sampling circuits, which can separate signals of a corresponding phase from other signals through sampling, can be used as well for the signal separator 500 and the first and second samplers 510 and 520.

FIG. 5 further illustrates that the first maximum level detector 600 can detect the maximum level of the first voltage signal SWA and output a first maximum level SWA1 and the second maximum level detector 650 can detect the maximum level of the second voltage signal SWB and output a second maximum level SWB1. Any types of maximum level detection circuits that detect the maximum level of an input signal, output the detected level, and maintain it during a specific interval can be used as the first and second maximum level detectors 600 and 650.

FIG. 5 further illustrates that the first comparison unit 700 can compare the first maximum level SWA1 with the second maximum level SWB1, detect, whether the difference between SWA1 and SWB1 is higher than a predetermined allowable level, and output its detection signal EOL, short for "end-of-life".

Figure 8A:
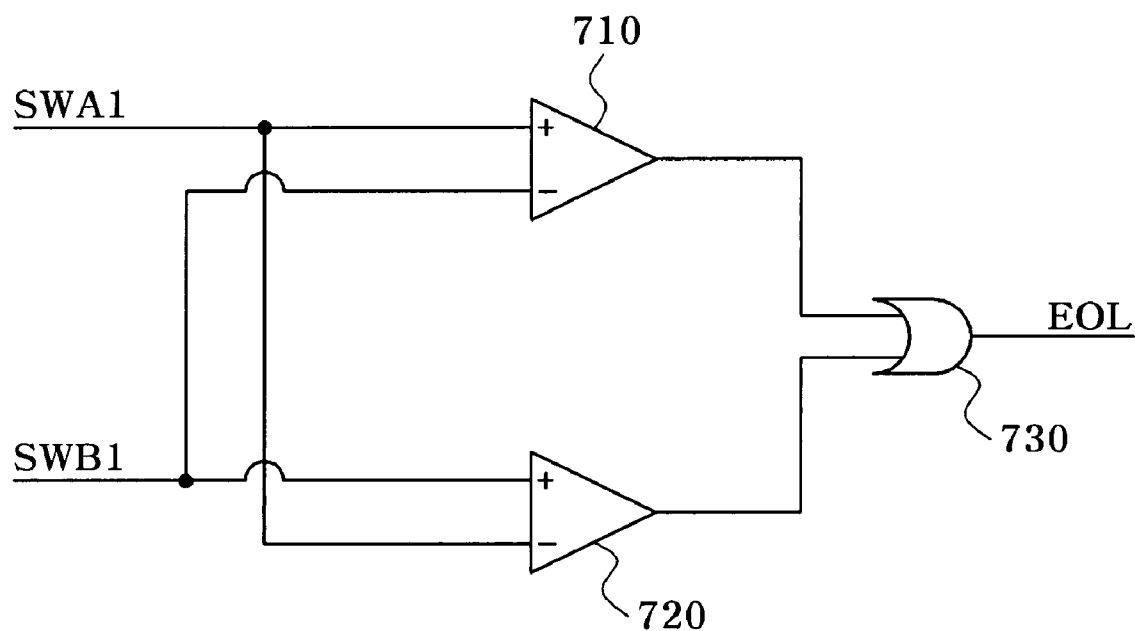
FIG. 8A illustrates the configuration of a first comparison unit included in the circuit for detecting the end of life of a fluorescent lamp according to the embodiment.

FIG. 8A illustrates the detailed operations of the first comparison unit 700. A comparator 710 in the first comparison unit 700 can receive the first maximum level SWA1 through a non-inverting terminal and the second maximum level SWB1 through an inverting terminal. The comparator 710 can compare the first and second maximum levels SWA1 and SWB1, respectively, and output the resulting comparison. If the first maximum level SWA1 is higher than the second maximum level SWB1 by more than a predetermined allowable level, the comparator 710 can output a high-level signal, otherwise it can output a low-level signal.

A comparator 720 can receive the first maximum level SWA1 through an inverting terminal and the second maximum level SWB1 through a non-inverting terminal. The comparator 720 can compare the first and second maximum levels SWA1 and SWB1, respectively, and output the result of the comparison. If the second maximum level SWB1 is higher than the first maximum level SWA1 by more than a predetermined allowable level, the comparator 720 can output a high-level signal, otherwise it can output a low-level signal.

A logic unit 730 can calculate a logical sum, or OR, of a signal from the comparator 710 and a signal from the comparator 720, and output a detection signal EOL. If the difference between the first and second maximum levels SWA1 and SWB1 is higher than the allowable level, a high detection signal EOL is output by the logic unit 730, otherwise a low level signal is output.

In response to the detection result EOL from the first comparison unit 700, the controller 800 can determine whether or not the fluorescent lamp is at the end of its life. Specifically, if the detection signal EOL is high, the controller 800 can determine that the fluorescent lamp is at the end of its life and thus turns off the ballast 100.

As described above, the embodiment of the circuit for detecting the end of life of a fluorescent lamp can compare the first maximum level SWA1 corresponding to the maximum level of the voltage signal Vdet in intervals in which the voltage signal Vdet is positive and the second maximum level SWB1 corresponding to the maximum level of the voltage signal Vdet in intervals in which the voltage signal Vdet is negative and then determine that the fluorescent lamp is at the end of its life if the difference between the first and second maximum levels SWA1 and SWB1 is higher than a predetermined allowable level. If only the lower electrode of the fluorescent lamp 20 in FIG. 6 is blackened, conventional methods cannot detect the darkening since the conventional methods detect only the maximum level of the voltage signal in intervals in which the voltage signal is positive. However, the described embodiments can detect not only darkening of the upper electrode but also darkening of the lower electrode by comparing the first and second maximum levels SWA1 and SWB1. Therefore, these embodiments make it possible to detect the decay of the performance of fluorescent lamps in an early stage of the end of life process and to effectively protect the ballast, the socket, and other relevant circuits of the fluorescent lamp.

Furthermore, the second comparison unit 750 can compare the first and second maximum levels SWA1 and SWB1 with a predetermined reference voltage VREF and detect whether at least one of the first maximum level SWA1 and the second maximum level SWB1 is higher than the predetermined reference voltage VREF and outputs its detection signal OVP, short for Over Voltage Protection.

Figure 8B:
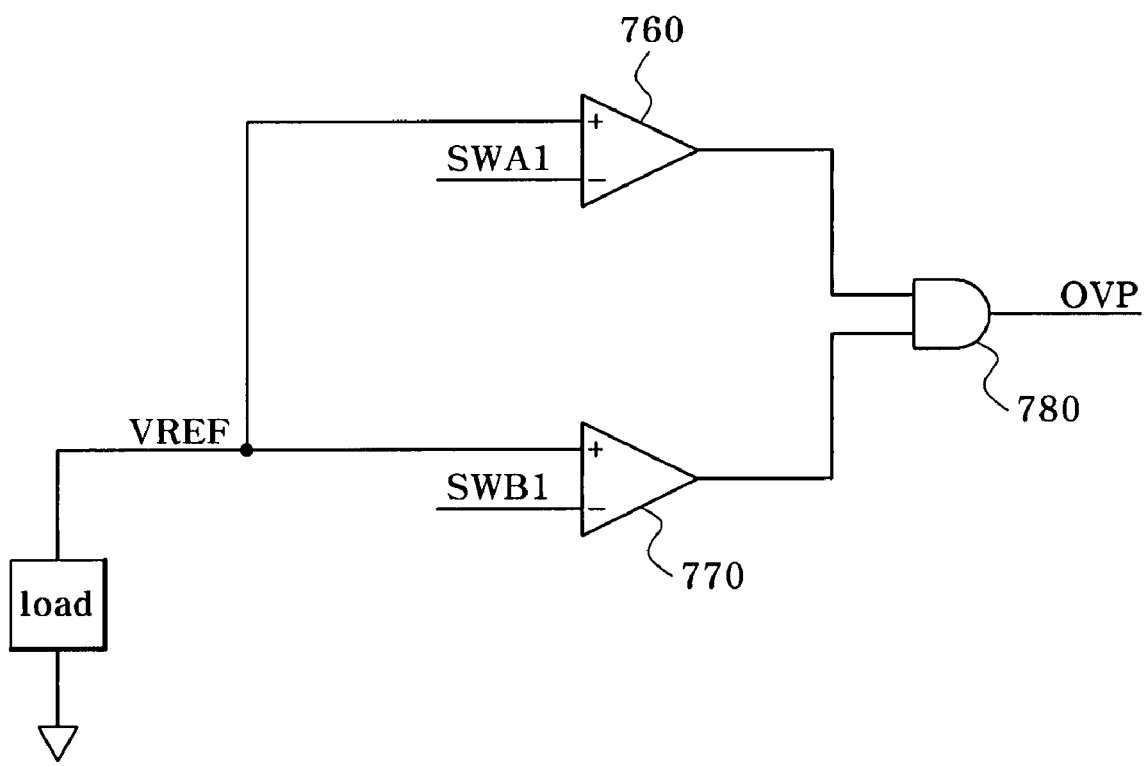
FIG. 8B illustrates the configuration of a second comparison unit included in the circuit for detecting the end of life of a fluorescent lamp according to the embodiment.

FIG. 8B illustrates the detailed operations of the second comparison unit 750. A comparator 760 in the second comparison unit 750 can receive the first maximum level SWA1 through an inverting terminal and a reference voltage VREF through a non-inverting terminal, compare the first maximum level SWA1 with the reference voltage VREF, and output the result of the comparison. If the first maximum level SWA1 is higher than the reference voltage VREF, the comparator 760 can output a low-level signal, otherwise a high-level signal.

A comparator 770 can receive the second maximum level SWB1 through an inverting terminal and the reference voltage VREF through a non-inverting terminal, compare the second maximum level SWB1 with the reference voltage VREF, and output the result of the comparison. If the second maximum level SWB1 is higher than the reference voltage VREF, the comparator 770 can output a low-level signal, otherwise a high-level signal.

A logic unit 780 can calculate a logical product, or AND, of a signal from the comparator 760 and a signal from the comparator 770, and output a detection signal OVP. Accordingly, if either signal from the comparators 760 or 770 is low, the logic unit 780 can output a low-level detection signal OVP. Thus, the detection signal OVP is low if either the first maximum level SWA1 or the second maximum level SWB1 is higher than the reference voltage VREF.

In response to the detection result OVP, received from the second comparison unit 750, the controller 800 can determine whether or not the fluorescent lamp is at the end of its life. Specifically, if the detection signal OVP is low, the controller 800 can determine that the fluorescent lamp is at the end of its life and thus turns off the ballast 100.

The described embodiments of the circuit for detecting the end of life of a fluorescent lamp can compare the first maximum level SWA1 corresponding to the maximum level of the voltage signal Vdet in intervals in which the voltage signal Vdet is positive and the second maximum level SWB1 corresponding to the maximum level of the voltage signal Vdet in intervals in which the voltage signal Vdet is negative with the predetermined reference voltage VREF and then determine that the fluorescent lamp is at the end of its life if either the first or second maximum levels SWA1 and SWB1 is higher than the reference voltage VREF. Accordingly, even when the difference between the first and second maximum levels SWA1 and SWB1 is small due to darkening of both the upper and lower electrodes of the fluorescent lamp 20 in FIG. 6, the deterioration of the performance of the fluorescent lamps can be detected in an early stage of the end of life process by comparing the first and second maximum levels SWA1 and SWB1 with the reference voltage VREF and detecting the blackening of both the electrodes.

The above described embodiments provide a circuit for detecting the end of life of a fluorescent lamp. Embodiments effectively detect not only the simultaneous blackening of both electrodes of the fluorescent lamp, but also situations when only one of the two electrodes has been darkened. The embodiments are sensitive enough to detect the decay of performance of the fluorescent lamp in an early stage of the end of life process, thereby effectively protecting the ballast, the socket, and other relevant circuits of the fluorescent lamp.

Although embodiments of the present invention have been disclosed for illustrative purposes, those skilled in the art will appreciate that various modifications, additions and substitutions are possible without departing from the scope and spirit of the invention, which is defined only by the accompanying claims.

What is claimed is:

1. A circuit for detecting the end of life of a fluorescent lamp, the circuit comprising:
    a rectifier for rectifying a voltage signal received from a ballast and outputting a rectified voltage;
    a phase detector for detecting a phase of the voltage signal and outputting a phase detection signal;
    a signal separator for separating the rectified voltage, received from the rectifier, on a phase basis to generate a first voltage signal and a second voltage signal in response to the phase detection signal;
    a first maximum level detector for detecting a maximum level of the first voltage signal;
    a second maximum level detector for detecting a maximum level of the second voltage signal;
    a first comparison unit for comparing the first maximum level detected by the first maximum level detector and the second maximum level detected by the second maximum level detector and detecting whether a difference between the first and second maximum levels is higher than a predetermined allowable level; and
    a controller for determining whether the fluorescent lamp is at the end of life in response to the detection result from the first comparison unit.

2. The circuit according to claim 1, further comprising:
    a buffer for buffering the voltage signal detected from the ballast, the buffer being coupled between the ballast and the rectifier.

3. The circuit according to claim 2, wherein the buffer is configured to perform an inversion buffering of the voltage signal.

4. The circuit according to claim 3, wherein the buffer comprises:
    a comparator for receiving the voltage signal through an inverting terminal and a ground voltage through a non-inverting terminal and performing a comparison operation; and
    a resistor provided between the inverting terminal and an output terminal of the comparator.

5. The circuit according to claim 2, wherein the rectifier includes:
    a first comparator for receiving the voltage signal buffered by the buffer and the ground voltage and performing a comparison operation;
    a first diode provided between an output terminal of the first comparator and a first node;
    a second diode provided between the output terminal of the first comparator and a second node; and
    a second comparator for receiving a signal from the first node and a signal from the second node and performing a comparison operation to output the rectified voltage.

6. The circuit according to claim 5, wherein the first comparator receives the voltage signal through an inverting terminal and receives the ground voltage through a non-inverting terminal.

7. The circuit according to claim 6, wherein the second comparator receives the signal from the first node through an inverting terminal and receives the signal from the second node through a non-inverting terminal.

8. The circuit according to claim 7, wherein the rectifier further comprises:
    a first resistor coupled between the inverting terminal of the first comparator and the first node; and
    a second resistor provided between an output terminal and the inverting terminal of the second comparator.

9. The circuit according to claim 5, wherein an inverted voltage from the output terminal of the first comparator is applied to the first diode and a forward voltage from the output terminal of the first comparator is applied to the second diode.

10. The circuit according to claim 2, wherein the phase detection signal comprises a first phase detection signal associated with a detection of a positive phase of the voltage signal and a second phase detection signal associated with a detection of a negative phase of the voltage signal.

11. The circuit according to claim 10, wherein the phase detector comprises:
    a comparator for receiving the voltage signal buffered by the buffer and a ground voltage and performing a comparison operation to output the first phase detection signal; and an inverter for inverting an output of the comparator to output the second phase detection signal.

12. The circuit according to claim 11, wherein the comparator receives the buffered voltage signal through an inverting terminal and receives the ground voltage through a non-inverting terminal.

13. The circuit according to claim 1, wherein the first comparison unit comprises:
   a first comparator for receiving the first maximum level through a non-inverting terminal and the second maximum level through an inverting terminal and performing a comparison operation;
   a second comparator for receiving the first maximum level through an inverting terminal and the second maximum level through a non-inverting terminal and performing a comparison operation; and
   a logic unit for performing a logical operation between an output signal of the first comparator and an output signal of the second comparator.

14. The circuit according to claim 13, wherein the logical unit is configured to perform a logical sum operation.

15. The circuit according to claim 1, further comprising:
   a second comparison unit for comparing the first and second maximum levels with a predetermined reference voltage and detecting whether or not at least one of the first and second maximum levels is higher than the predetermined reference voltage,
   wherein the controller determines whether or not the fluorescent lamp is at the end of life in response to the detection from the second comparison unit.

16. The circuit according to claim 15, wherein the second comparison unit comprises:
   a first comparator for receiving the first maximum level through an inverting terminal and the reference voltage through a non-inverting terminal and performing a comparison operation;
   a second comparator for receiving the second maximum level through an inverting terminal and the reference voltage through a non-inverting terminal and performing a comparison operation; and
   a logic unit for performing a logical operation between an output signal from the first comparator and an output signal from the second comparator.

17. The circuit according to claim 16, wherein the logical unit is configured to perform a logical product operation.

18. The circuit according to claim 1, wherein ballast is configured to generate the voltage signal by a division of a voltage between electrodes of the fluorescent lamp.

19. The circuit according to claim 1, wherein the controller is configured to turn off the ballast if it is determined that the fluorescent lamp is at the end of life.

* * * * *